United States Patent
Thakur et al.

(10) Patent No.: US 9,337,818 B1
(45) Date of Patent: May 10, 2016

(54) BUFFER CIRCUIT FOR VOLTAGE CONTROLLED OSCILLATOR

(71) Applicant: FREESCALE SEMICONDUCTOR, INC., Austin, TX (US)

(72) Inventors: Krishna Thakur, Noida (IN); Deependra K. Jain, Noida (IN); Devesh P. Singh, Uttar Pradesh (IN); Anand Kumar Sinha, Noida (IN); Avinash Chandra Tripathi, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/833,122

(22) Filed: Aug. 23, 2015

(51) Int. Cl.
| | |
|---|---|
| *H03L 7/06* | (2006.01) |
| *H03K 5/134* | (2014.01) |
| *H03K 3/03* | (2006.01) |
| *H03K 19/0185* | (2006.01) |
| *H03L 7/08* | (2006.01) |
| *H03L 7/099* | (2006.01) |
| *H03K 5/00* | (2006.01) |

(52) U.S. Cl.
CPC .............. *H03K 5/134* (2014.07); *H03K 3/0315* (2013.01); *H03K 19/018521* (2013.01); *H03L 7/0805* (2013.01); *H03L 7/0995* (2013.01); *H03K 2005/00019* (2013.01)

(58) Field of Classification Search
CPC ... H03L 7/0814; H03L 7/0812; H03L 7/0891; H03L 7/18; H03L 7/093; G11C 7/222
USPC ........ 327/147–159, 333; 331/74, 57; 375/376
See application file for complete search history.

(56) References Cited

U.S. PATENT DOCUMENTS

| | | | |
|---|---|---|---|
| 5,682,123 A | 10/1997 | Chau | |
| 5,796,313 A * | 8/1998 | Eitan .................... | H03K 3/0315 326/27 |
| 5,942,947 A | 8/1999 | Bhagwan | |
| 6,285,214 B1 * | 9/2001 | Zipper ................... | H03F 3/345 326/80 |
| 2005/0270110 A1 | 12/2005 | Chatterjee | |
| 2009/0146702 A1 * | 6/2009 | Chen ...................... | G11C 5/145 327/148 |
| 2010/0019825 A1 * | 1/2010 | Ali ................... | H03K 19/018521 327/333 |
| 2013/0043922 A1 * | 2/2013 | Srivastava ................ | G06F 1/28 327/208 |

* cited by examiner

*Primary Examiner* — Lincoln Donovan
*Assistant Examiner* — Thomas Skibinski
(74) *Attorney, Agent, or Firm* — Charles E. Bergere (57) ABSTRACT

A buffer circuit includes an inverter and a level-shifter. The inverter receives a first oscillating signal at a first voltage level and generates an inverted version of the first oscillating signal at a second voltage level. The level-shifter receives a second oscillating signal at a third voltage level, which has a phase difference from the first oscillating signal, and the inverted first oscillating signal, and generates a buffer output signal at a fourth voltage level.

10 Claims, 5 Drawing Sheets

BUFFER CIRCUIT FOR VOLTAGE CONTROLLED OSCILLATOR

BACKGROUND

The present invention relates generally to a buffer circuit for a voltage controlled oscillator (VCO), and, more particularly, to a buffer circuit of a VCO used in delayed lock loop and phase locked loop circuitry.

A phase-locked loop (PLL) includes a voltage-controlled oscillator (VCO) that generates an oscillating signal whose frequency is controlled by an input control voltage. Buffer circuits are commonly used in PLLs to level-shift the oscillating signal. The PLL receives and operates at a supply voltage and the VCO operates at a first voltage level that is less than the supply voltage. The VCO includes a voltage-to-current converter, a current-controlled oscillator (CCO), and a VCO buffer. The voltage-to-current converter converts the input control voltage into a current input and the CCO generates the oscillating signal based on the current input. A ring oscillator is the most commonly used CCO and includes an odd number of cascade-connected inverters that generate oscillating signals that have a known phase difference. Each oscillating signal oscillates from zero to the first voltage level. The buffer circuit is connected to the output of the VCO to level-shift the voltage level of the oscillating signal to the supply voltage in order to obtain a rail-to-rail output voltage.

Figure 1:
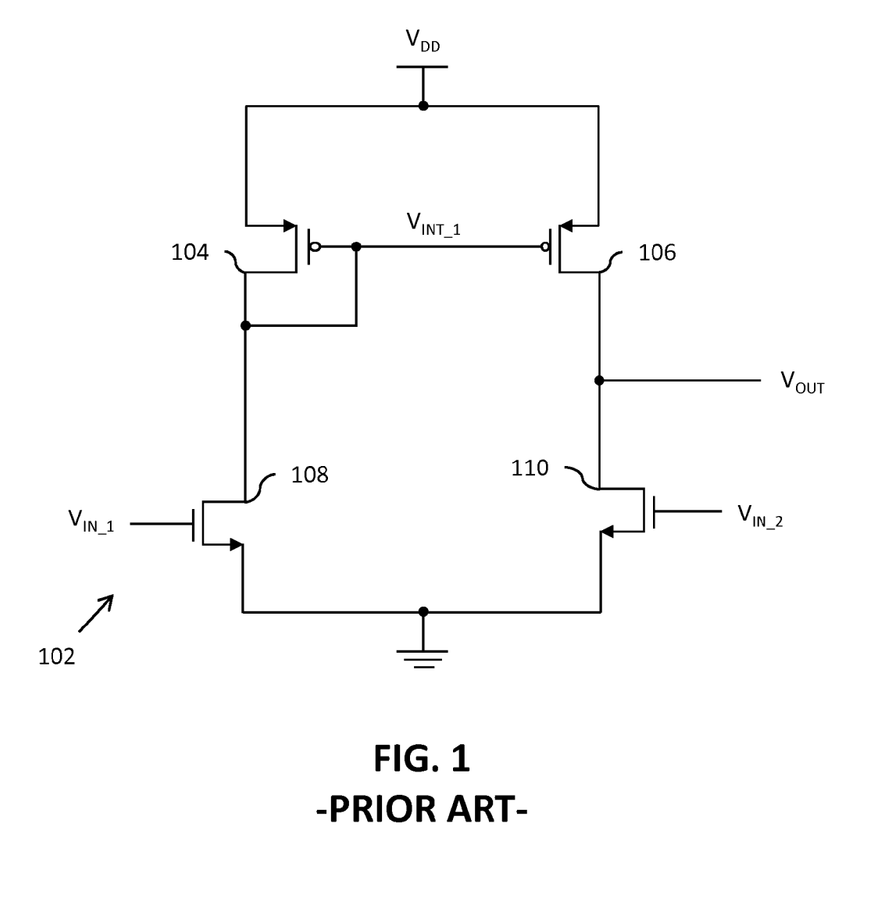
FIG. 1 is a schematic circuit diagram of a conventional buffer circuit.

FIG. 1 shows a conventional VCO buffer circuit 102. The buffer circuit 102 includes first through fourth transistors 104-110. The first transistor 104 has a source connected to a supply voltage and a drain connected to its gate. The second transistor 106 has a source connected to the supply voltage and a gate connected to the gate of the first transistor 104 for receiving a first intermediate signal ($V_{INT\_1}$). The third transistor 108 has a drain connected to the drain of the first transistor 104 for generating the first intermediate signal, a gate for receiving a first input signal ($V_{IN\_1}$), and a source connected to ground. The fourth transistor 110 has a drain connected to the drain of the second transistor 106 for generating an output signal ($V_{OUT}$), a gate for receiving a second input signal ($V_{IN\_2}$), and a source connected to ground. The first and second transistors 104 and 106 are p-channel metal oxide semiconductor (PMOS) transistors and the third and fourth transistors 108 and 110 are n-channel metal oxide semiconductor (NMOS) transistors. The second input signal is an inverted version of the first input signal.

The first transistor 104 functions as a diode. The first and second transistors 104 and 106 form a current mirror circuit, with the second transistor 106 mirroring a current carried by the first transistor 104. When the first input signal is high, the second input signal is low. The fourth transistor 110 receives the second input signal at logic low state at its gate, and hence is switched OFF. The third transistor 108 receives the first input signal at logic high state at its gate, and hence is switched ON. The third transistor 108 generates the first intermediate signal at logic low state at its drain terminal. The second transistor 106 receives the first intermediate signal at logic low state at its gate and hence is switched ON. The second transistor 106 then generates the output signal at logic high state, thereby buffering the first input signal.

When the first input signal is low, the second input signal is high. The third transistor 108 receives the low first input signal at its gate and hence is switched OFF. The fourth transistor 110 receives the second input signal at logic high state at its gate and hence is switched ON. The fourth transistor 110 generates the output signal at logic low state, thereby buffering the first input signal. However, when the first input signal is high, the first and third transistors 104 and 108 are switched ON. Hence, there is a path from a voltage source (which provides the supply voltage to the buffer circuit 102) to ground through the first and third transistors 104 and 108. This leads to static power dissipation. Therefore, the buffer circuit 102 consumes a large amount of power.

Other conventional techniques for buffering input signals use multiple transistors that function as diodes, and hence, consume a large amount of power. Therefore, it would be advantageous to have a buffer circuit for a VCO that reduces power consumption.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In PLLs and DLLs, generally there is difference between ring and digital supply voltage levels, which can create duty cycle distortion/static power consumption in the buffers used in the VCO. To reduce power consumption and distortion, the present invention provides a buffer circuit for use in a VCO. The buffer circuit can be used for buffering any ring phase, as well as a prior phase. The prior ring phase is used to avoid static current through the main buffer arm and achieve ~50% duty cycle. The buffer circuit also has very small voltage overshoot its output. Further, the buffer circuit operates with single-ended VCO/delay line.

The present invention provides a buffer circuit that is particularly suitable for use in a VCO. The buffer circuit comprises a first inverter for receiving a first oscillating signal and generating an inverted version of the first oscillating signal, and a level-shifter circuit. The level-shifter circuit comprises a first transistor having a gate connected to the first inverter for receiving the inverted version of the first oscillating signal, and source that receives a supply voltage. A second transistor has a gate for receiving a second oscillating signal and a source connected to a drain of the first transistor. A third transistor has a gate for receiving the second oscillating signal and connected to the gate of the second transistor, a source connected to ground, and a drain connected to a drain of the second transistor for generating a buffer output signal. In one embodiment, the buffer circuit includes a second inverter connected to the level shifter circuit for receiving the buffer output signal and generating an output signal, wherein the output signal is a level-shifted version of the second oscillating signal. In another embodiment, the buffer circuit includes a fourth transistor having a gate terminal connected to the second terminal of the first transistor, and first and second terminals connected to ground, wherein the fourth transistor functions as a capacitor to filter high frequency components of the inverted version of the first oscillating signal.

In another embodiment of the present invention, a voltage-controlled oscillator is provided. The voltage-controlled oscillator includes a voltage-to-current converter, a ring oscillator, and a buffer circuit. The voltage-to-current converter receives an input voltage and generates an output current. The ring oscillator includes a plurality of inverters that receive the output current and generate corresponding plurality of oscillating signals. The plurality of oscillating signals have a predetermined phase difference therebetween. The buffer circuit includes a first inverter circuit and a level-shifter circuit. The first inverter circuit includes first and second transistors. The first transistor has a gate terminal connected to the ring oscillator for receiving a first oscillating signal of the plurality of oscillating signals and a first terminal for receiving a supply voltage. The first oscillating signal is at a first voltage level. The second transistor has a gate terminal connected to the ring oscillator for receiving the first oscillating signal, a first terminal connected to ground, and a second terminal connected to a second terminal of the first transistor for generating an inverted version of the first oscillating signal. The inverted version of the first oscillating signal is at a second voltage level. The level-shifter circuit includes third through fifth transistors. The third transistor has a gate terminal connected to the second terminal of the first transistor for receiving the inverted version of the first oscillating signal and a first terminal for receiving the supply voltage. The fourth transistor has a gate terminal connected to the ring oscillator for receiving a second oscillating signal of the plurality of oscillating signals and a first terminal connected to a second terminal of the third transistor. The second oscillating signal is at a third voltage level. The fifth transistor has a gate terminal connected to the ring oscillator for receiving the second oscillating signal, a first terminal connected to ground, and a second terminal connected to a second terminal of the fourth transistor for generating a buffer output signal. The buffer output signal is at a fourth voltage level.

In yet another embodiment of the present invention, a voltage-controlled delay line is provided. The voltage-controlled delay line includes a voltage-to-current converter, a delay chain, and a buffer circuit. The voltage-to-current converter receives an input voltage and generates an output current. The delay chain includes a plurality of inverters that receive the output current and an input clock signal and generate corresponding plurality of clock signals. The plurality of clock signals have a predetermined phase difference therebetween. The buffer circuit includes a first inverter circuit and a level-shifter circuit. The first inverter circuit includes first and second transistors. The first transistor has a gate terminal connected to the delay chain for receiving a first clock signal of the plurality of clock signals and a first terminal for receiving a supply voltage. The first clock signal is at a first voltage level. The second transistor has a gate terminal connected to the delay chain for receiving the first clock signal, a first terminal connected to ground, and a second terminal connected to a second terminal of the first transistor for generating an inverted version of the first clock signal. The inverted version of the first clock signal is at a second voltage level. The level-shifter circuit includes third through fifth transistors. The third transistor has a gate terminal connected to the second terminal of the first transistor for receiving the inverted version of the first clock signal and a first terminal for receiving the supply voltage. The fourth transistor has a gate terminal connected to the delay chain for receiving a second clock signal of the plurality of clock signals and a first terminal connected to a second terminal of the third transistor. The second clock signal is at a third voltage level. The fifth transistor has a gate terminal connected to the delay chain for receiving the second clock signal, a first terminal connected to ground, and a second terminal connected to a second terminal of the fourth transistor for generating a buffer output signal. The buffer output signal is at a fourth voltage level.

The buffer circuit includes a first inverter circuit and a level-shifter circuit. The first inverter circuit receives a first oscillating signal at a first voltage level and generates an inverted version of the first oscillating signal at a second voltage level. The level-shifter circuit receives a second oscillating signal at a third voltage level and the inverted version of the first oscillating signal and generates a buffer output signal at a fourth voltage level.

The buffer circuit further includes a second inverter circuit for receiving the buffer output signal and generating an output signal. The output signal is at the second voltage level, i.e., the output signal is an inverted version of the buffer output signal. The first and second oscillating signals oscillate between the first and third voltage levels. The inverted version of the first oscillating signal and the buffer output signal oscillate between the second and fourth voltage levels. Hence, the second oscillating signal is level-shifted from the third voltage level to the second voltage level. The output signal is a level-shifted version of the second oscillating signal. There is no continuous direct path between a voltage source (not shown), which provides a supply voltage to the buffer circuit, and ground. Hence, power dissipation is reduced, which improves performance of the buffer circuit.

Figure 2:
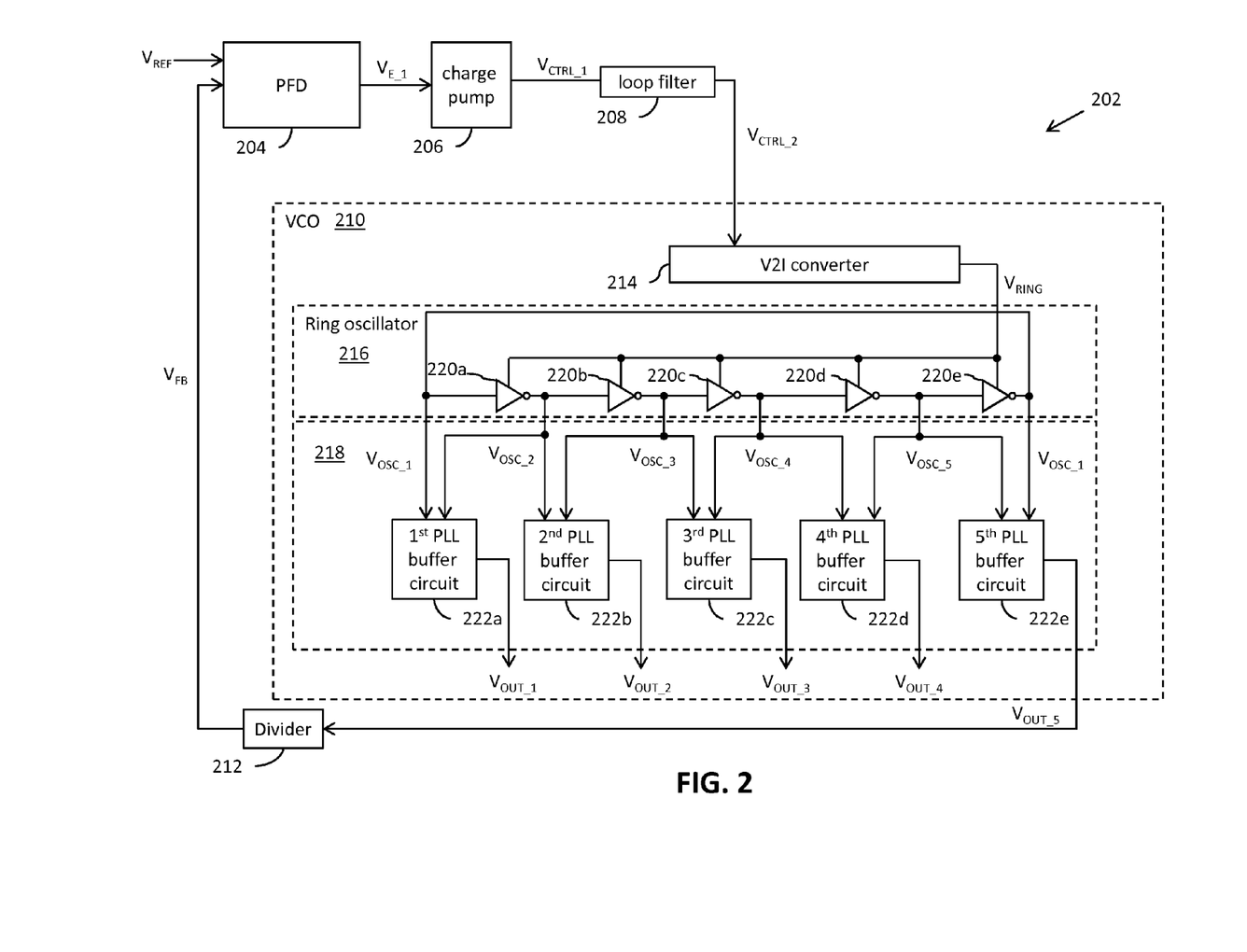
FIG. 2 is a schematic block diagram of a phase-locked loop (PLL) in accordance with an embodiment of the present invention.

Referring now to FIG. 2, a schematic block diagram of a phase-locked loop (PLL) 202 in accordance with an embodiment of the present invention is shown. The PLL 202 includes a phase-frequency detector (PFD) 204, a charge pump 206, a loop filter 208, a VCO 210, and a divider 212. The VCO 210 includes a voltage-to-current converter 214, a ring oscillator 216, and VCO buffer circuitry 218.

The PFD 204 is connected to the divider 212 for receiving a feedback signal ($V_{FB}$) from the divider 212. The PFD 204 further receives a reference voltage ($V_{REF}$) and compares a phase of the feedback signal $V_{FB}$ with a phase of the reference voltage $V_{REF}$ to generate a first error signal ($V_{E\_1}$) based on the detected phase difference.

The charge pump 206 is connected to the PFD 204 and receives the first error signal $V_{E\_1}$ and generates a first control signal ($V_{CTRL\_1}$).

The loop filter 208 is connected to the charge pump 206 and receives the first control signal $V_{CTRL\_1}$ and generates a second control signal ($V_{CTRL\_2}$). The loop filter 208 may comprises a first capacitor connected between the output of the charge pump 206 and ground, and a resistor and second capacitor connected in series with each other and between the output of the charge pump 206 and ground. The loop filter 208 provides the second control signal $V_{CTRL\_2}$ to the VCO 210.

The VCO 210 receives the second control signal $V_{CTRL\_2}$ and generates first through fifth output signals ($V_{OUT\_1}$-$V_{OUT\_5}$). The divider 212 is connected to the VCO 210 and receives the last output signal, which in this embodiment is the fifth output signal $V_{OUT\_5}$. The divider 212 generates and provides a fraction of the fifth output signal $V_{OUT\_5}$ to the PFD 204 as the feedback signal.

The voltage-to-current converter 214 is connected to the loop filter 208 and receives the second control signal VCTRL_2 and generates a first current signal. The ring oscillator 216 is connected to the voltage-to-current converter 214 for receiving the first current signal and generating first through fifth oscillating signals ($V_{OSC\_1}$-$V_{OSC\_5}$). The first through fifth oscillating signals oscillate between voltage levels of high and low supply voltages received by the ring oscillator 216.

The ring oscillator 216 includes first through fifth series connected inverters 220a-220e. The first inverter 220a receives the first oscillating signal and generates the second oscillating signal. The second inverter 220b receives the second oscillating signal and generates the third oscillating signal. The third inverter 220c receives the third oscillating signal and generates the fourth oscillating signal. The fourth inverter 220d receives the fourth oscillating signal and generates the fifth oscillating signal. The fifth inverter 220e receives the fifth oscillating signal and generates the first oscillating signal. As will be understood by those of skill in the art, the first through fifth oscillating signals have a predetermined phase difference therebetween. Also as will be understood by those of skill in the art, the ring oscillator 216 may have fewer or more inverters depending requirements.

In one embodiment, the first through fifth oscillating signals have a phase difference of 216 degrees. It will be understood by those of skill in the art that the phase difference between the first through fifth oscillating signals may be different from 216 degrees.

The VCO buffer circuitry 218 is connected to the ring oscillator 216 for receiving the first through fifth oscillating signals and generating the corresponding first through fifth output signals $V_{OUT\_1}$-$V_{OUT\_5}$. The first through fifth output signals $V_{OUT\_1}$-$V_{OUT\_5}$ oscillate between voltage levels of high and low supply voltages received by the VCO buffer circuitry 218.

More specifically, the VCO buffer circuit 218 includes first through fifth PLL buffer circuits 222a-222e. The first PLL buffer circuit 222a receives the first and second oscillating signals $V_{OSC\_1}$ and $V_{OSC\_2}$ and generates the first output signal $V_{OUT\_1}$. The second PLL buffer circuit 222b receives the second and third oscillating signals $V_{OSC\_2}$ and $V_{OSC\_3}$ and generates the second output signal $V_{OUT\_2}$. The second output signal $V_{OUT\_2}$ is a level-shifted version of the third oscillating signal $V_{OSC\_3}$. The third PLL buffer circuit 222c receives the third and fourth oscillating signals and generates the third output signal. The third output signal is a level-shifted version of the fourth oscillating signal. The fourth PLL buffer circuit 222d receives the fourth and fifth oscillating signals and generates the fourth output signal. The fourth output signal is a level-shifted version of the fifth oscillating signal. The fifth PLL buffer circuit 222e receives the fifth and first oscillating signals and generates the fifth output signal. The fifth output signal is a level-shifted version of the first oscillating signal.

The voltage level of the high supply voltage received by the ring oscillator 216 is equal to a ring voltage ($V_{RING}$). The voltage level of the high supply voltage received by the VCO buffer circuitry 218 is equal to a first supply voltage ($V_{DD\_1}$). In an example, the voltage level of the low supply voltage received by the ring oscillator 216 is equal to the voltage level of the low supply voltage received by the VCO buffer circuitry 218.

Figure 3:
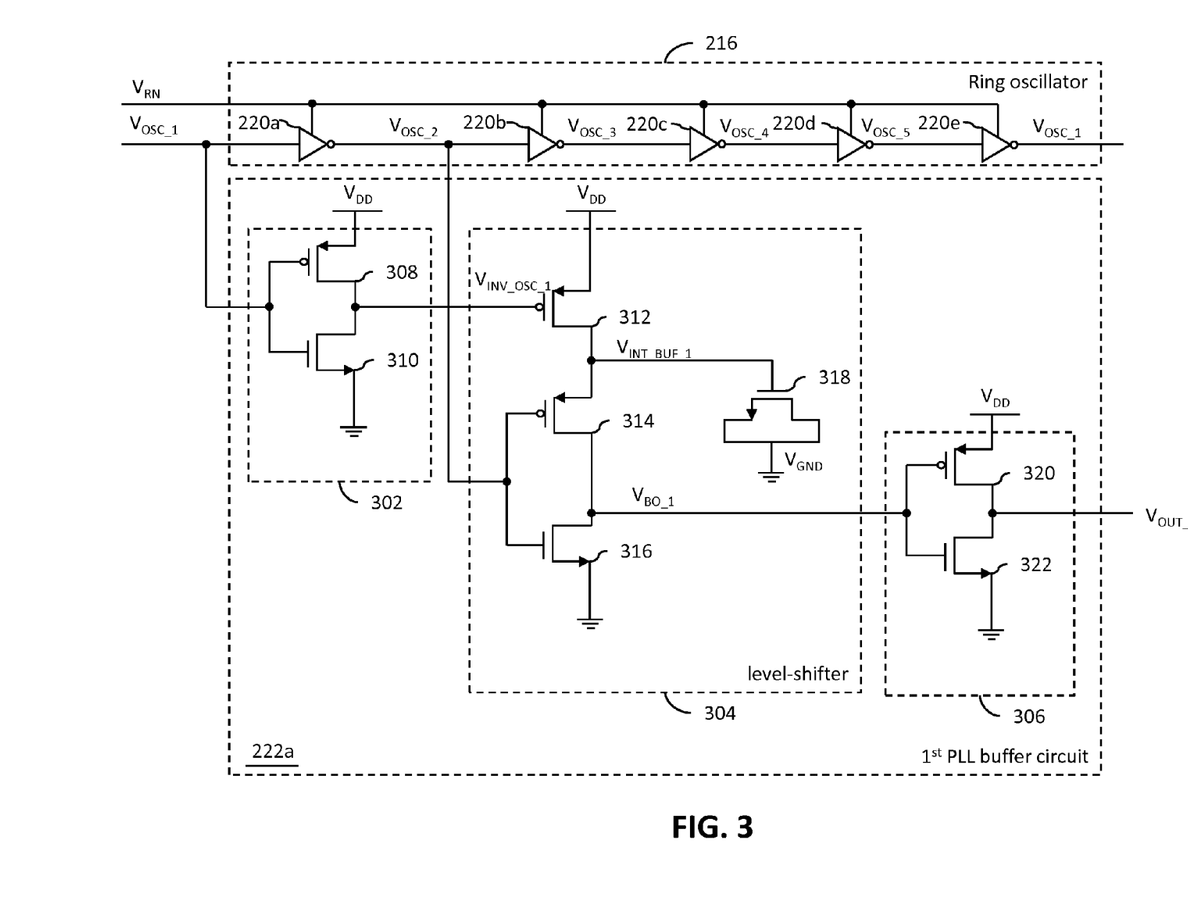
FIG. 3 is a schematic circuit diagram of a PLL buffer circuit of the PLL of FIG. 2 in accordance with an embodiment of the present invention.

Referring now to FIG. 3, a schematic circuit diagram of the first PLL buffer circuit 222a of FIG. 2, in accordance with an embodiment of the present invention, is shown. The first PLL buffer circuit 222a includes a first complementary metal-oxide semiconductor (CMOS) inverter 302, a level-shifter circuit 304, and a second CMOS inverter 306.

The first CMOS inverter 302 includes first and second transistors 308 and 310. The first transistor 308 has a source terminal for receiving the first supply voltage and a gate terminal connected to the ring oscillator 216 for receiving the first oscillating signal. The second transistor 310 has a gate terminal connected to the ring oscillator 216 for receiving the first oscillating signal, a source terminal connected to ground, and a drain terminal connected to a drain terminal of the first transistor 308 for generating an inverted version of the first oscillating signal.

The level-shifter circuit 304 includes third through fifth transistors 312-316. The third transistor 312 has a source terminal for receiving the first supply voltage and a gate terminal connected to the drain terminal of the first transistor 308 for receiving the inverted version of the first oscillating signal. The fourth transistor 314 has a gate terminal connected to the ring oscillator 216 for receiving the second oscillating signal and a source terminal connected to a drain terminal of the third transistor 312 for generating a first internal buffer signal ($V_{INT\_BUF\_1}$). The fifth transistor 316 has a gate terminal connected to the gate terminal of the fourth transistor 314 and connected to the ring oscillator 216 for receiving the second oscillating signal, a drain terminal connected to a drain terminal of the fourth transistor 314 for generating a first buffer output signal ($V_{BO\_1}$), and a source terminal connected to ground. In one preferred embodiment, the level shifter 204 includes a sixth transistor 318 that has a gate terminal connected to the drain terminal of the third transistor 312 for receiving the first intermediate buffer signal, a source terminal connected to ground, and a drain terminal connected to ground. The sixth transistor 318 acts as a capacitor to filter high frequency components of the oscillating input signal.

The second CMOS inverter 306 includes seventh and eighth transistors 320 and 322. The seventh transistor 320 has a source terminal for receiving the first supply voltage and a gate terminal connected to the drain terminal of the fourth transistor 314 for receiving the first buffer output signal. The eighth transistor 322 has a gate terminal connected to the drain terminal of the fourth transistor 314 for receiving the first buffer output signal, a source terminal connected to ground, and a drain terminal connected to a drain terminal of the seventh transistor 320 for generating the first output signal.

In the embodiment shown, the first, third, fourth, and seventh transistors 308, 312, 314, and 320 are p-channel metal-oxide semiconductor (PMOS) transistors and the second, fifth, sixth, and eighth transistors 310, 316, 318, and 322 are re-channel metal-oxide semiconductor (NMOS) transistors.

In operation, the first and second oscillating signals have a phase difference therebetween. When the first oscillating signal is at a voltage level equal to the ring voltage, the second oscillating signal is at a voltage level equal to ground. The first oscillating signal is high (i.e., at logic high state) when the voltage level of the first oscillating signal is equal to the ring voltage. The second oscillating signal is low (i.e., at logic low state) when the voltage level of the second oscillating signal is equal to ground. The first transistor 308 receives the first oscillating signal at logic high state at its gate terminal and hence is switched OFF. The second transistor 310 receives the first oscillating signal at logic high state at its gate terminal and hence is switched ON. The second transistor 310 generates the inverted version of the first oscillating signal at logic low state at its drain terminal. The third transistor 312 receives the inverted version of the first oscillating signal at logic low state at its gate terminal and hence is switched ON. The third transistor 312 generates the first intermediate buffer signal at logic high state at its drain terminal. The sixth transistor 318 receives the first intermediate buffer signal at logic high state at the gate terminal thereof and hence is switched ON and so reduces high frequency ripples in the first intermediate buffer signal. The fourth transistor 314 receives the second oscillating signal at logic low state at its gate terminal and hence is switched ON. The fourth transistor 314 receives the first intermediate buffer signal at logic high state at its source terminal and generates the first buffer output signal at a logic high state at its drain terminal.

A voltage level of the first buffer output signal is equal to the first supply voltage when the first buffer output signal is high. The fifth transistor 316 receives the second oscillating signal at logic low state at its gate terminal and hence is switched OFF. The seventh transistor 320 receives the first buffer output signal at logic high state at its gate terminal and hence is switched OFF. The eighth transistor 322 receives the first buffer output signal at logic high state at its gate terminal and hence is switched ON so the eighth transistor 322 generates the first output signal at a logic low state at its drain terminal. Hence, the first output signal is low when the second oscillating signal is low.

When the first oscillating signal is low (i.e., ground level), the second oscillating signal is at the voltage level equal to the ring voltage. The second oscillating signal is high when the voltage level of the second oscillating signal is equal to the ring voltage. The first and second transistors 308 and 310 receive the first oscillating signal at logic low state at their gate terminals, so the first transistor 308 is switched ON and the second transistor 310 is switched OFF, and the first transistor 308 generates the inverted version of the first oscillating signal, which is high. A voltage level of the inverted version of the first oscillating signal is equal to the first supply voltage when the first oscillating signal is low. The third transistor 312 receives the high inverted version of the first oscillating signal at its gate terminal and hence is switched OFF.

The fourth and fifth transistors 314 and 316 receive the second oscillating signal, which is high, at their gates, so the fourth transistor 314 is switched OFF and the fifth transistor is switched ON, and then the first buffer output signal at a logic low state is generated at the drain terminal of the fifth transistor 316. The eighth transistor 322 (that acts as a capacitor) receives the low first buffer output signal at its gate terminal and hence is switched OFF. The seventh transistor 320 receives the low first buffer output signal at its gate terminal so is switched ON and so the seventh transistor 320 generates the first output signal at a logic high state at its drain terminal. A voltage level of the first output signal is equal to the first supply voltage when the first output signal is high. Therefore, the first output signal is at a voltage level equal to the first supply voltage when the second oscillating signal is at the voltage level equal to the ring voltage. Hence, the first PLL buffer circuit 222a level-shifts the second oscillating signal.

The first PLL buffer circuit 222a does not include a path from a voltage source (not shown), which provides the first supply voltage to the first PLL buffer circuit 222a, to ground. Therefore, static power dissipation is reduced, which saves power and improves performance.

Further, each PLL buffer circuit 222 buffers an oscillating signal based on a level-shifted version of another oscillating signal for generating a buffered oscillating signal. Hence, a duty cycle of the buffered oscillating signal is improved. For example, the first PLL buffer circuit 222a buffers the second oscillating signal based on a level-shifted version the first oscillating signal. Therefore, a duty cycle of the first output signal is approximately equal to a duty cycle of the second oscillating signal. Hence, the first PLL buffer circuit 222a reduces power consumption, and improves the duty cycle of the first output signal.

The second through fifth PLL buffer circuits 222b-222e are structurally and functionally similar to the first PLL buffer circuit 222a.

Figure 4:
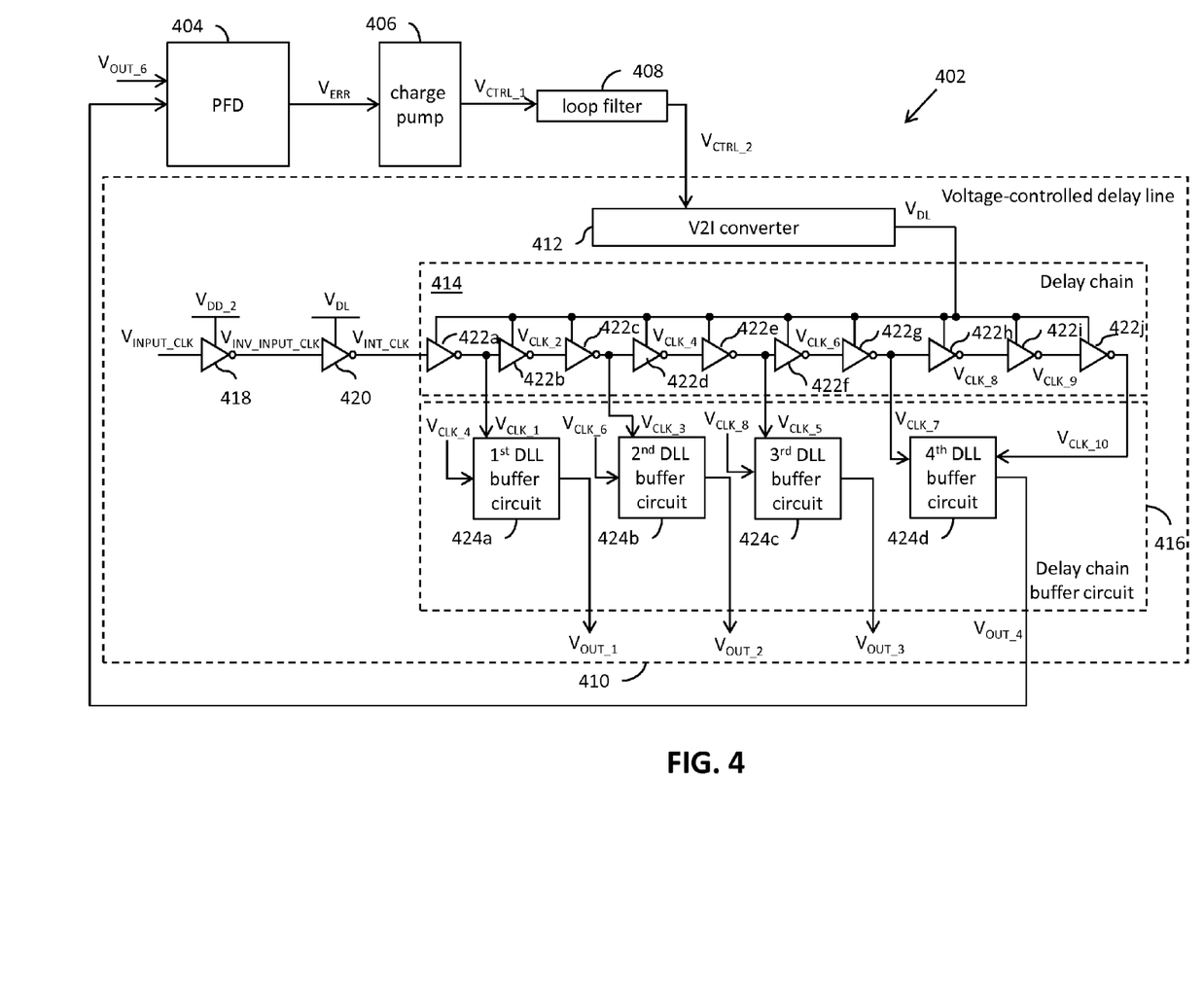
FIG. 4 is a schematic block diagram of a delay-locked loop (DLL) in accordance with an embodiment of the present invention.

Referring now to FIG. 4, a schematic block diagram of a delay-locked loop (DLL) 402 in accordance with an embodiment of the present invention is shown. The DLL 402 includes a PFD 404, a charge pump 406, a loop filter 408, and a voltage-controlled delay line 410. The voltage-controlled delay line 410 includes a voltage-to-current converter 412, a delay chain 414, a delay chain buffer circuit 416, and first and second inverters 418 and 420.

The first inverter 418 receives an input clock signal ($V_{INPUT\_CLK}$) and a second supply voltage ($V_{DD\_2}$) and generates an inverted version of the input clock signal ($V_{INV\_INPUT\_CLK}$). The second inverter 420 is connected to the first inverter 418 and receive the inverted version of the input clock signal $V_{INV\_INPUT\_CLK}$ and a delay chain voltage ($V_{DL}$) from the voltage-to-current converter and generates an intermediate clock signal ($V_{INT\_CLK}$). The delay chain 414 receives the intermediate clock signal (at the first inverter in the chain 422a) as well as the delay chain voltage and generates first through tenth clock signals ($V_{CLK\_1}$-$V_{CLK\_10}$). The first through tenth clock signals oscillate between voltage levels of high and low supply voltages received by the delay chain 414. The delay chain 414 includes third through twelfth series connected inverters 422a-422j for generating the first through tenth clock signals $V_{CLK\_1}$-$V_{CLK\_10}$, where the third inverter 422a is connected to the second inverter 420 for receiving the intermediate clock signal and generating the first clock signal, while the twelfth inverter 422j generates the tenth clock signal.

In one embodiment, the first through tenth clock signals have a phase difference of 60 degrees therebetween. However, it will be understood by those of skill in the art that the phase difference between the first through tenth clock signals may be different from 60 degrees.

The delay chain buffer circuit 416 is connected to the delay chain 414 for receiving the first through tenth clock signals and generating first through fourth output signals ($V_{OUT\_1}$-$V_{OUT\_4}$). The output signals oscillate between voltage levels of high and low supply voltages received by the delay chain buffer circuit 416. The delay chain buffer circuit 416 includes first through fourth DLL buffer circuits 424a-424d. The first DLL buffer circuit 424a receives the first and fourth clock signals and generates the first output signal. The first output signal is a level-shifted version of the fourth clock signal. The second DLL buffer circuit 424b receives the third and sixth clock signals and generates the second output signal, which is a level-shifted version of the sixth clock signal. The third DLL buffer circuit 424c receives the fifth and eighth clock signals and generates the third output signal, which is a level-shifted version of the eighth clock signal. The fourth DLL buffer circuit 424d receives the seventh and tenth clock signals and generates the fourth output signal (i.e., a feedback signal), which is a level-shifted version of the tenth clock signal.

The PFD 404 receives the first and fourth output signals and compares their phases and generates an error signal ($V_{ERR}$) based on the detected phase difference. The charge pump 406 is connected to the PFD 404 for receiving the error signal and generating and providing a first control signal ($V_{CTRL\_1}$). The loop filter 408 is connected to the charge pump 406 for receiving the first control signal and generating a second control signal ($V_{CTRL\_2}$). In one embodiment, the loop filter 408 comprises a capacitor connected between the charge pump 406 output and ground. The voltage-to-current converter 412 is connected to the loop filter 408 for receiving the second control signal $V_{CTRL\_2}$. The voltage-to-current converter 412 then generates and provides the current signal $V_{DL}$ to the third through twelfth inverters 422a-422j of the delay chain 414. The current signal is at a voltage level of the delay chain voltage.

The voltage level of the high supply voltage received by the delay chain 414 is equal to the delay chain voltage. The voltage level of the high supply voltage received by the delay chain buffer circuitry 416 is equal to the second supply voltage. In one embodiment, the voltage level of the low supply voltage received by the delay chain 414 is equal to the voltage level of the low supply voltage received by the delay chain buffer circuitry 416.

Figure 5:
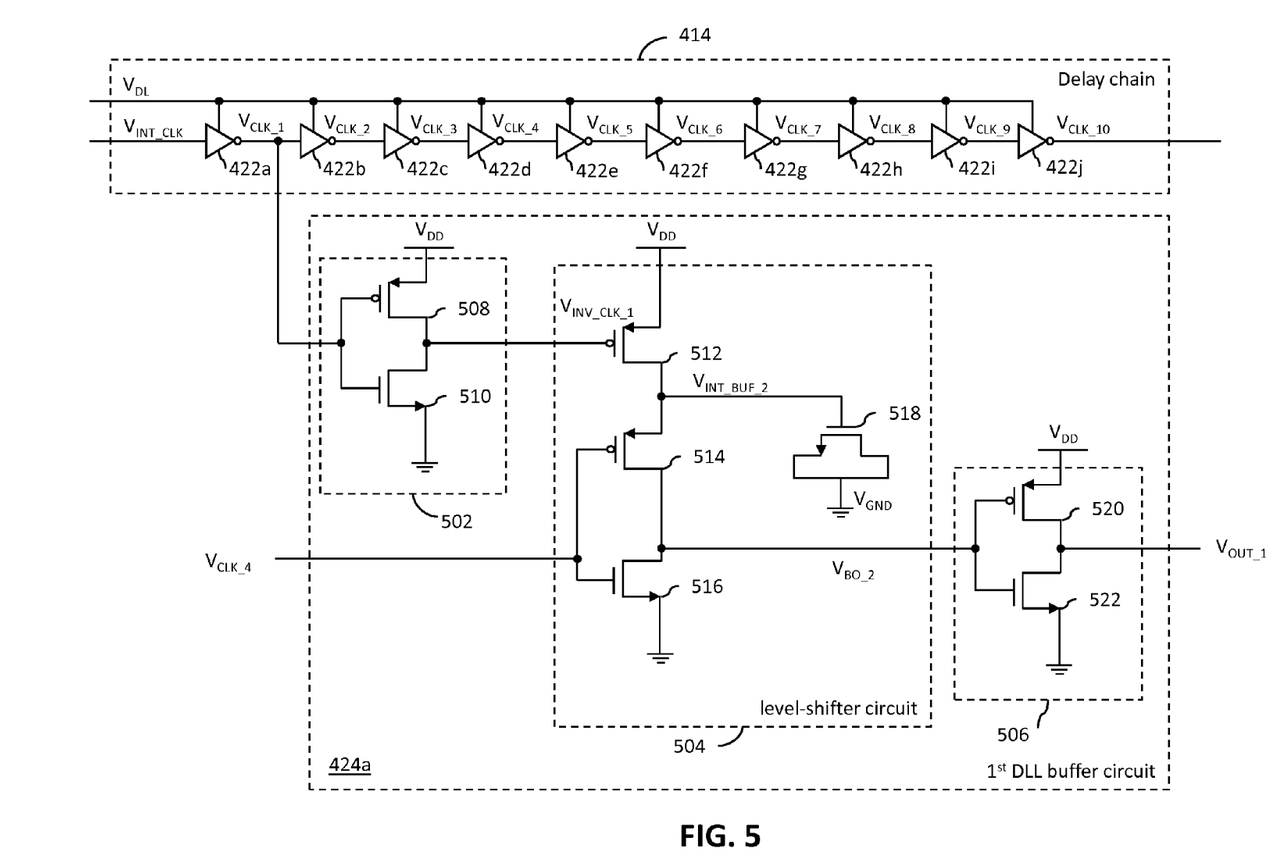
FIG. 5 is a schematic circuit diagram of a DLL buffer circuit of the DLL of FIG. 4 in accordance with an embodiment of the present invention.

Referring now to FIG. 5, a schematic circuit diagram of the first DLL buffer circuit 424a of the DLL 402 of FIG. 4 in accordance with an embodiment of the present invention is shown. The first DLL buffer circuit 424a includes a first CMOS inverter 502, a level-shifter circuit 504, and a second CMOS inverter 506. The DLL buffer circuit 424 has essentially the same circuit structure as the PLL buffer circuit 222.

In detail, the first CMOS inverter 502 includes first and second transistors 508 and 510. The first transistor 508 has a source terminal for receiving the second supply voltage and a gate terminal connected to the delay chain 414 for receiving the first clock signal. The second transistor 510 has a gate terminal connected to the delay chain 414 for receiving the first clock signal, a source terminal connected to ground, and a drain terminal connected to a drain terminal of the ninth transistor 508 for generating an inverted version of the first clock signal ($V_{INV\_CLK\_1}$). The level-shifter circuit 504 includes third through fifth transistors 512-516. The third transistor 512 has a source terminal for receiving the second supply voltage and a gate terminal connected to the drain terminal of the first transistor 508 for receiving the inverted version of the first clock signal. The fourth transistor 514 has a gate terminal connected to the delay chain 414 for receiving the fourth clock signal and a source terminal connected to a drain terminal of the third transistor 512 for generating a second internal buffer signal ($V_{INT\_BUF\_2}$). The fifth transistor 516 has a gate terminal connected to the delay chain 414 for receiving the fourth clock signal, a drain terminal connected to a drain terminal of the fourth transistor 514 for generating a second buffer output signal ($V_{BO\_2}$), and a source terminal connected to ground. In one embodiment, the level-shifter circuit 504 includes a sixth transistor 518 that functions as a capacitor (like the sixth transistor 318 of FIG. 3). The sixth transistor 518 has a gate terminal connected to the drain terminal of the third transistor 512 for receiving the second intermediate buffer signal, and source and drain terminals connected to ground. The second CMOS inverter 506 includes seventh and eighth transistors 520 and 522. The seventh transistor 520 has a source terminal for receiving the second supply voltage and a gate terminal connected to the drain terminal of the fourth transistor 514 for receiving the second buffer output signal. The eighth transistor 522 has a gate terminal connected to the drain terminal of the fourth transistor 514 for receiving the second buffer output signal, a source terminal connected to ground, and a drain terminal connected to a drain terminal of the seventh transistor 520 for generating the sixth output signal.

In one embodiment, the first, third, fourth, and seventh transistors 508, 512, 514, and 520 are PMOS transistors and the second, fifth, sixth and eighth transistors 510, 316, 318, and 322 are NMOS transistors.

In operation, the first and fourth clock signals have a phase difference therebetween. When the first clock signal is at a voltage level equal to the delay chain voltage, the fourth clock signal is at a voltage level equal to ground. The first clock signal is high when the voltage level of the first clock signal is equal to the delay chain voltage. The fourth clock signal is low when the voltage level of the fourth clock signal is equal to ground. The first and second transistors 508 and 510 receive the first clock signal at logic high state at their gates so the first transistor 508 is turned OFF and the second transistor 510 is switched ON, and the second transistor 510 generates the inverted version of the first clock signal at logic low state at its drain terminal. The third transistor 512 receives the inverted version of the first clock signal at logic low state at its gate and so is turned ON and generates the second intermediate buffer signal at logic high state at its drain. The sixth transistor 518 receives the second intermediate buffer signal at logic high state at its gate and so is switched ON. The sixth transistor 518 functions as a capacitor and reduces high frequency ripples in the second intermediate buffer signal. The fourth transistor 514 receives the fourth clock signal at logic low state at its gate and hence is switched ON. The fourth transistor 514 receives the second intermediate buffer signal at logic high state at its source terminal and generates the first buffer output signal at logic high state at its drain terminal. A voltage level of the second buffer output signal is equal to the second supply voltage when the second buffer output signal is high. The seventh transistor 520 receives the second buffer output signal at logic high state at its gate and hence is switched OFF, while the eighth transistor 522 is switched ON and so the first output signal at logic low state is generated at the drain of the eighth transistor 522. Hence, the first output signal is at logic low state when the second oscillating signal is at logic low state.

When the first clock signal is at the voltage level equal to ground, the fourth clock signal is at the voltage level equal to the ring voltage. The first clock signal is low when the voltage level of the first clock signal is equal to ground. The fourth clock signal is high when the voltage level of the fourth clock signal is equal to the ring voltage. Therefore, the first output signal is at voltage level equal to the second supply voltage when the fourth clock signal is at the voltage level equal to the ring voltage. Hence, the first DLL buffer circuit 424a level-shifts the fourth clock signal.

The second through fourth DLL buffer circuits 424b-424d are structurally and functionally similar to the first DLL buffer circuit 424a.

The first DLL buffer circuit 424a does not include a path from a voltage source (not shown), which provides the second supply voltage to the first DLL buffer circuit 424a, to ground. Therefore, static power dissipation across the first DLL buffer circuit 424a is reduced. Further, each DLL buffer circuit 424 buffers a clock signal based on a level-shifted version of another clock signal for generating a buffered clock signal. Hence, a duty cycle of the buffered clock signal is improved. In one embodiment, the first DLL buffer circuit 424a buffers the fourth clock signal based on a level-shifted version of the first clock signal. Therefore, a duty cycle of the first output signal is approximately equal to a duty cycle of the fourth clock signal.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims. No element, act, or instruction used in the present application should be construed as critical or essential to the invention unless explicitly described as such. Further, the phrase "based on" is intended to mean "based, at least in part, on" unless explicitly stated otherwise.

The invention claimed is:

1. A buffer circuit for use in a voltage controlled oscillator, comprising:
   a first inverter for receiving a first oscillating signal and generating an inverted version of the first oscillating signal; and
   a level-shifter circuit, comprising:
      a first transistor having a gate terminal connected to the first inverter for receiving the inverted version of the first oscillating signal, and a first terminal that receives a supply voltage;
      a second transistor having a gate terminal for receiving a second oscillating signal and a first terminal connected to a second terminal of the first transistor; and
      a third transistor having a gate terminal for receiving the second oscillating signal and connected to the gate terminal of the second transistor, a first terminal connected to ground, and a second terminal connected to a second terminal of the second transistor for generating a buffer output signal.

2. The buffer circuit of claim 1, further comprising a second inverter connected to the level shifter circuit for receiving the buffer output signal and generating an output signal, wherein the output signal is a level-shifted version of the second oscillating signal.

3. The buffer circuit of claim 2, further comprising a fourth transistor having a gate terminal connected to the second terminal of the first transistor, and first and second terminals connected to ground, wherein the fourth transistor functions as a capacitor to filter high frequency components of the inverted version of the first oscillating signal.

4. The buffer circuit of claim 2, wherein the first inverter comprises:
   a fifth transistor having a gate terminal for receiving the first oscillating signal and a first terminal for receiving a supply voltage; and
   a sixth transistor having a gate terminal for receiving the first oscillating signal and connected to the gate terminal of the fifth transistor, a first terminal connected to ground, and a second terminal connected to a second terminal of the first transistor, wherein the inverted version of the first oscillating signal is generated at the node between the second terminals of the fifth and sixth transistors.

5. The buffer circuit of claim 4, wherein the second inverter comprises:
   a seventh transistor having a gate terminal connected to the second terminal of the second transistor for receiving the buffer output signal and a first terminal for receiving the supply voltage; and
   an eighth transistor having a gate terminal connected to the second terminal of the second transistor and to the gate terminal of the seventh transistor, a first terminal connected to ground, and a second terminal connected to a second terminal of the seventh transistor, wherein the output signal is generated at the node connecting the second terminals of the seventh and eighth transistors.

6. A voltage-controlled oscillator for a phase locked loop, comprising:
   a voltage-to-current converter that receives an input voltage and generates an output current therefrom;
   a ring oscillator connected to the voltage-to-current converter, wherein the ring oscillator includes a plurality of series connected inverters with a last one of the inverters having an output connected to a first one of the inverters, wherein the inverters receive the output current and generate a corresponding plurality of oscillating signals having a predetermined phase difference therebetween;
   a voltage controlled oscillator buffer circuit including a plurality of PLL buffer circuits connected to the ring oscillator for receiving the oscillating signals, wherein each buffer circuit receives one of the oscillating signals and a previous one of the oscillating signals and generates an output signal, and wherein each of the PLL buffer circuits comprises:
      a first inverter for receiving a first oscillating signal and generating an inverted version of the first oscillating signal; and
      a level-shifter circuit, comprising:
         a first transistor having a gate terminal connected to the first inverter for receiving the inverted version of the first oscillating signal, and a first terminal that receives a supply voltage;
         a second transistor having a gate terminal for receiving a second oscillating signal and a first terminal connected to a second terminal of the first transistor; and
         a third transistor having a gate terminal for receiving the second oscillating signal and connected to the gate terminal of the second transistor, a first terminal connected to ground, and a second terminal connected to a second terminal of the second transistor for generating a buffer output signal.

7. The buffer circuit of claim 6, further comprising a second inverter connected to the level shifter circuit for receiving the buffer output signal and generating an output signal, wherein the output signal is a level-shifted version of the second oscillating signal.

8. The buffer circuit of claim 7, further comprising a fourth transistor having a gate terminal connected to the second terminal of the first transistor, and first and second terminals connected to ground, wherein the fourth transistor functions as a capacitor to filter high frequency components of the inverted version of the first oscillating signal.

9. The buffer circuit of claim 7, wherein the first inverter comprises:
   a fifth transistor having a gate terminal for receiving the first oscillating signal and a first terminal for receiving a supply voltage; and
   a sixth transistor having a gate terminal for receiving the first oscillating signal and connected to the gate terminal of the fifth transistor, a first terminal connected to ground, and a second terminal connected to a second terminal of the first transistor, wherein the inverted version of the first oscillating signal is generated at the node between the second terminals of the fifth and sixth transistors.

10. The buffer circuit of claim 9, wherein the second inverter comprises:

a seventh transistor having a gate terminal connected to the second terminal of the second transistor for receiving the buffer output signal and a first terminal for receiving the supply voltage; and an eighth transistor having a gate terminal connected to the second terminal of the second transistor and to the gate terminal of the seventh transistor, a first terminal connected to ground, and a second terminal connected to a second terminal of the seventh transistor, wherein the output signal is generated at the node connecting the second terminals of the seventh and eighth transistors.

* * * * *